United States Patent
Yamanaka et al.

(10) Patent No.: US 11,737,252 B2
(45) Date of Patent: Aug. 22, 2023

(54) TAPE-FEEDER SETTING WORK APPARATUS

(71) Applicant: FUJI CORPORATION, Chiryu (JP)

(72) Inventors: Hidekazu Yamanaka, Chiryu (JP); Norio Hosoi, Chiryu (JP); Keita Tanaka, Takahama (JP)

(73) Assignee: FUJI CORPORATION, Chiryu (JP)

( * ) Notice: Subject to any disclaimer, the term of this patent is extended or adjusted under 35 U.S.C. 154(b) by 166 days.

(21) Appl. No.: 17/266,312

(22) PCT Filed: Sep. 26, 2018

(86) PCT No.: PCT/JP2018/035623
§ 371 (c)(1),
(2) Date: Feb. 5, 2021

(87) PCT Pub. No.: WO2020/065752
PCT Pub. Date: Apr. 2, 2020

(65) Prior Publication Data
US 2021/0307223 A1 Sep. 30, 2021

(51) Int. Cl.
*H05K 13/02* (2006.01)
*H05K 13/04* (2006.01)
*H05K 13/08* (2006.01)

(52) U.S. Cl.
CPC ......... *H05K 13/02* (2013.01); *H05K 13/0419* (2018.08); *H05K 13/08* (2013.01)

(58) Field of Classification Search
CPC ..... H05K 13/02; H05K 13/0419; H05K 13/08
See application file for complete search history.

(56) References Cited

U.S. PATENT DOCUMENTS 10,743,446 B2 * 8/2020 Tanaka ............... H05K 13/0419
11,116,118 B2 * 9/2021 Takagi .................. H05K 13/02

FOREIGN PATENT DOCUMENTS

| CN | 104247588 A | 12/2014 |
| EP | 2 825 013 A1 | 1/2015 |

(Continued)

OTHER PUBLICATIONS

International Search Report dated Dec. 4, 2018 in PCT/JP2018/035623 filed on Sep. 26, 2018, 2 pages

*Primary Examiner* — Donghai D Nguyen
(74) *Attorney, Agent, or Firm* — Oblon, McClelland, Maier & Neustadt, L.L.P.

(57) ABSTRACT

Tape-feeder setting work apparatus (40), which is used when an operator performs a work of setting a component supply tape wound on tape reel (12), in tape feeder (10), includes feeder set base (41) configured to hold the tape feeder in the setting work of the component supply tape, power supply section (47) configured to supply a power to tape feeding device (29) inside the tape feeder, and operation section (51) configured to allow the operator to operate the tape feeding device inside the tape feeder. When a work of setting a tip portion of the component supply tape by pulling out the tip portion from the tape reel set in the tape feeder held by the feeder set base is performed, the operator operates the operation section of the tape-feeder setting work apparatus to operate a tape feeding operation of the tape feeding device inside the tape feeder, and feeds the tip portion of the component supply tape pulled out from the tape reel to a component pickup position of the tape feeder.

12 Claims, 7 Drawing Sheets

(56) References Cited

FOREIGN PATENT DOCUMENTS

| | | | | |
|---|---|---|---|---|
| JP | H05175686 | A | * | 7/1993 |
| JP | 4320199 | B2 | * | 2/2004 |
| JP | 5424686 | B2 | * | 2/2014 |
| JP | 2014-241344 | A | | 12/2014 |
| JP | WO2015/177834 | A1 | | 11/2015 |
| WO | 2008/078647 | A1 | * | 7/2008 |
| WO | 2014097473 | A1 | * | 6/2014 |

* cited by examiner

US 11,737,252 B2

TAPE-FEEDER SETTING WORK APPARATUS

TECHNICAL FIELD

The present specification discloses a technique relating to a tape-feeder setting work apparatus used when an operator performs a work of setting a component supply tape wound on a tape reel in a tape feeder.

BACKGROUND ART

In the tape feeder that supplies components to a component mounter, the operator needs to perform a work of setting the tape reel in a reel accommodation section of the tape feeder, pulling out the component supply tape from the tape reel, and setting the component supply tape in the tape feeder. In the setting work of the component supply tape, it is convenient in a case where a tip portion of the component supply tape pulled out from the tape reel can be fed to a component pickup position of the tape feeder by operating a tape feeding device inside the tape feeder, but in order to operate the tape feeding device, it is necessary to supply power to the tape feeding device.

Therefore, as described in Patent Literature 1 (JP-A-2014-241344), in the setting work of the component supply tape, using a feeder set base (feeder set jig), the tape feeder is set on the feeder set base, and a connector of the tape feeder for power and communication is inserted and connected to a connector of the feeder set base side, so that the power is supplied to the tape feeder from the feeder set base side.

Conventionally, as described in Patent Literature 2 (International Publication WO2015/177834), since the tape feeder is provided with an operation section for the operator to operate a tape feeding operation or the like, when the operator sets the tape feeder on the feeder set base, the power is supplied to the tape feeder from the feeder set base side. As a result, in the setting work of the component supply tape, the operator can operate the tape feeding operation of the tape feeding device inside the tape feeder and feed the tip portion of the component supply tape pulled out from the tape reel to the component pickup position of the tape feeder by operating the operation section of the tape feeder set on the feeder set base.

PATENT LITERATURE

Patent Literature 1: JP-A-2014-241344
Patent Literature 2: International Publication WO2015/177834

BRIEF SUMMARY

Technical Problem

Recently, since the tape feeder tends to be thinner and more compact, a space for providing the operation section in the tape feeder becomes narrower, so that the operation section tends to be narrower in width and smaller in size. The narrower the width and smaller the size of the operation section, the worse the operability of the operation section and the worse the efficiency of the setting work of the component supply tape.

In these days, the tape feeder is becoming thinner and more compact, and the space for providing the operation section in the tape feeder is practically eliminated, and a tape feeder without the operation section also appears. With the tape feeder without the operation section, since the operator cannot operate the tape feeding device inside the tape feeder in the setting work of the component supply tape, all the setting work of the component supply tape has to be performed manually, which is troublesome.

Solution to Problem

In order to solve the above problems, a tape-feeder setting work apparatus used when an operator performs a work of setting a component supply tape wound on a tape reel, in a tape feeder, the tape-feeder setting work apparatus includes a feeder set base configured to hold the tape feeder in the setting work of the component supply tape, a power supply section configured to supply a power to a tape feeding device inside the tape feeder, and an operation section configured to allow the operator to operate the tape feeding device inside the tape feeder, in which when a work of setting a tip portion of the component supply tape by pulling out the tip portion from the tape reel set in the tape feeder held by the feeder set base is performed, the operator operates the operation section to operate a tape feeding operation of the tape feeding device inside the tape feeder, and feeds the tip portion of the component supply tape pulled out from the tape reel to a component pickup position of the tape feeder.

In this case, since the operation section for operating the tape feeding device inside the tape feeder is provided in tape-feeder setting work apparatus, the size and position of the operation section can be provided at a size and position that are easy for the operator to operate, compared with a case where the operation section is provided in the tape feeder. Therefore, even when the size or position of the operation section of the tape feeder is difficult to operate, or even in a tape feeder without the operation section, the operator operates the operation section of the tape-feeder setting work apparatus, so that the setting work of the component supply tape can be performed efficiently.

DESCRIPTION OF EMBODIMENTS

Figure 1:
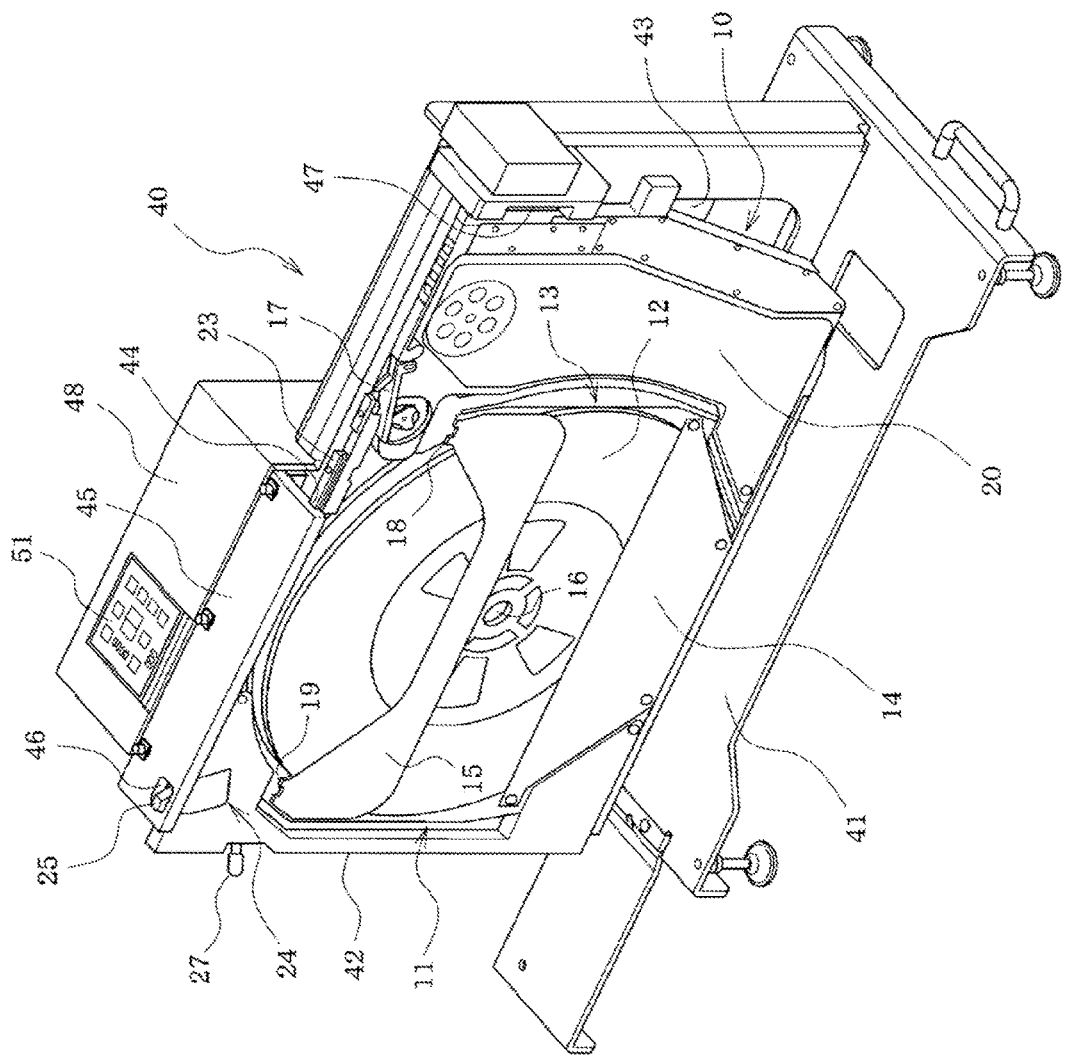
FIG. 1 is a perspective view showing a tape feeder set in the tape-feeder setting work apparatus of an embodiment.

Hereinafter, an embodiment disclosed in the present specification will be described.

First, a configuration of tape feeder 10 to be set in tape-feeder setting work apparatus 40 of the present embodiment will be described with reference to FIG. 3.

Feeder main body 11 of tape feeder 10 is formed in a thin case shape. Feeder main body 11 is provided with reel accommodation space 13 for rotatably accommodating tape reel 12 on which a component supply tape (not shown) is wound, and tape reel 12 is attached to and detached from reel accommodation space 13 through an opening portion on a side face of tape feeder 10. At a lower portion of reel accommodation space 13, reel cover 14 that covers a lower portion of tape reel 12 is provided. At an upper portion of reel accommodation space 13, reel holding plate 15 that covers an upper portion of tape reel 12 set in reel accommodation space 13 to hold tape reel 12 in a set state is provided to be opened and closed turnably with hinge portions 18 and 19 on both sides of an upper end portion thereof as fulcrums.

In a case of taking out tape reel 12 from reel accommodation space 13, reel holding plate 15 is turned upward with the hinge portions 18 and 19 on both sides of the upper end portion thereof as the fulcrums to open an upper side of reel accommodation space 13 and to allow the hand to grip an upper side of tape reel 12 in reel accommodation space 13 and pull out tape reel 12 obliquely upward while slightly tilting it outward.

On the other hand, in a case of setting tape reel 12 in reel accommodation space 13, a lower side of tape reel 12 is inserted into the inside of reel cover 14 from obliquely above, with respect to reel accommodation space 13 in which reel holding plate 15 is opened, and reel holding plate 15 is closed, so that the setting work of tape reel 12 in reel accommodation space 13 is completed. A closed state of reel holding plate 15 is held by a magnet, a spring, or the like.

In this case, a configuration may be adopted in which a short reel holding shaft (not shown) that is fitted into center hole 16 of tape reel 12 is provided in the central part of reel accommodation space 13 such that tape reel 12 is rotatably supported by the short reel holding shaft. In a case where the configuration is adopted, in order to prevent the reel holding shaft, which is fitted into center hole 16 of tape reel 12, from hindering the attachability and detachability of tape reel 12, the length of the reel holding shaft is preferably set to be shorter than the length of center hole 16 of tape reel 12 (for example, set to ½ to ⅓ of the length). Alternatively, a configuration may be adopted in which multiple rollers (not shown) are provided at a lower side of reel accommodation space 13 (inside of reel cover 14) along an outer circumference of tape reel 12 such that the outer circumference of tape reel 12 is rotatably borne and supported by the multiple rollers.

A component pickup position where a component is picked up with a suction nozzle (not shown) of a component mounter is set at a position near an end face portion, of an upper end face portion of feeder main body 11, on feeder main body 11 attachment direction side (front side). Tape guide 17 that guides the component supply tape pulled out from tape reel 12 to the component pickup position is provided at a lower side of the upper end face portion of feeder main body 11.

Figure 4:
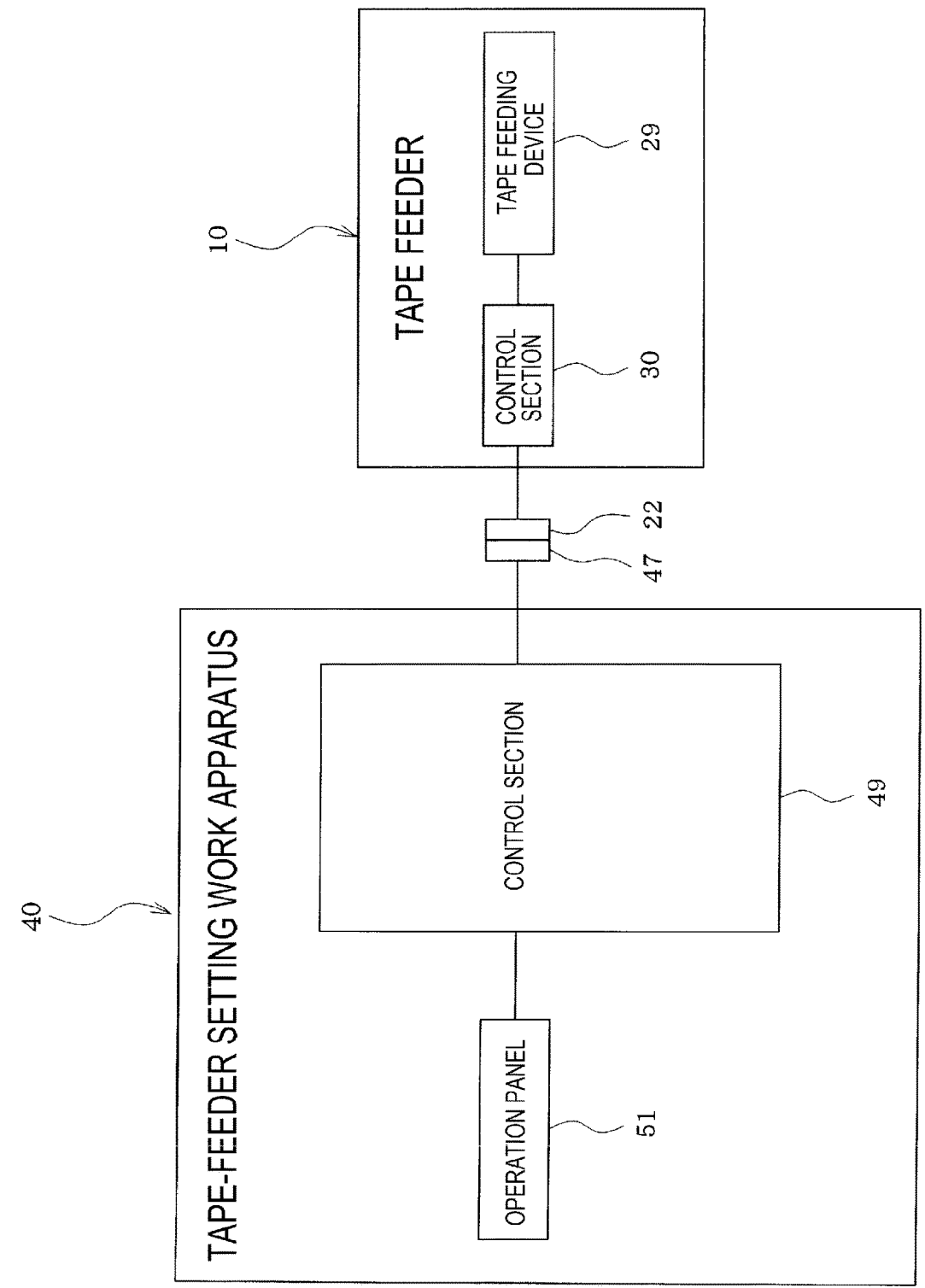
FIG. 4 is a block diagram showing an electrical connection relationship when the tape feeder is set in the tape-feeder setting work apparatus.

In feeder main body 11, a space between reel accommodation space 13 and the end face portion on feeder main body 11 attachment direction side (front side) serves as electrical equipment accommodation space 20. Electrical equipment accommodation space 20 accommodates various electrical equipment such as tape feeding device 29 (see FIG. 4) that pulls out the component supply tape from tape reel 12 in reel accommodation space 13 and pitch-feeds the component supply tape to the component pickup position, and control section 30 (see FIG. 4) that controls a pitch-feeding operation (tape feeding operation). Tape feeder 10 of the present embodiment is not provided with an operation section such as an operation panel for operating tape feeding device 29, but a tape feeder equipped with the operation section can also be used.

Two positioning pins 21, 21 (positioning portions) that perform positioning with respect to feeder setting section 31 (see FIGS. 5 and 6) of the component mounter are provided at a predetermined interval in a vertical direction at positions higher than the center in a height direction of the end face portion on feeder main body 11 attachment direction side (front side) (in the present embodiment, positions near the upper end face portion, of feeder main body 11). Connector 22 for both power supply and communication is provided between two positioning pins 21, 21 and, by inserting and connecting connector 22 of feeder main body 11 to a connector (not shown) of the component mounter side, power is supplied, from the component mounter side, to various electrical equipment such as tape feeding device 29 or control section 30 in feeder main body 11 and various signals such as control signals or sensor signals are transmitted and received between a control section (not shown) of the component mounter and control section 30 of feeder main body 11.

Next, a configuration in which feeder main body 11 is held in an attached state with respect to feeder setting section 31 of the component mounter will be described.

Figure 3:
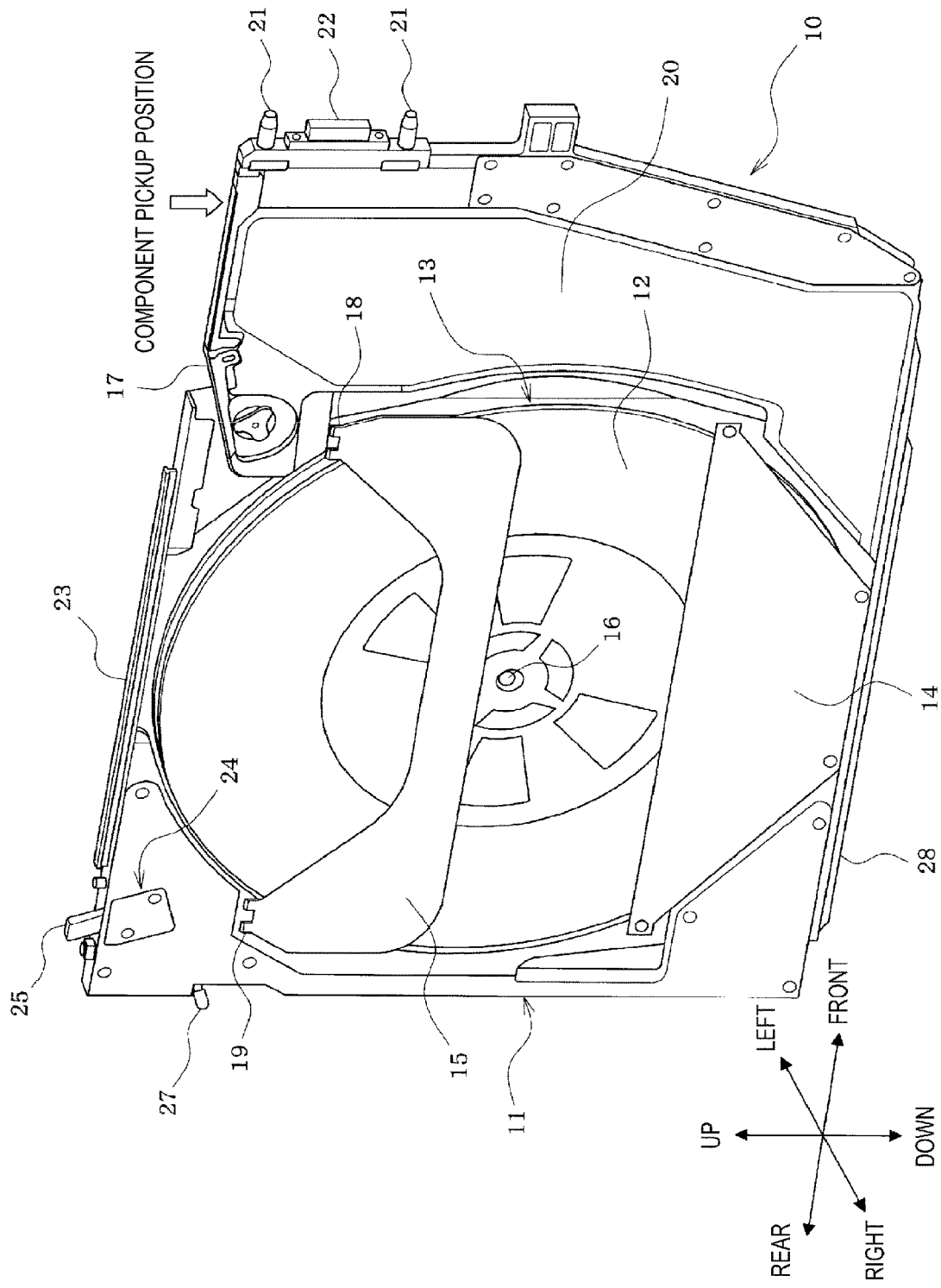
FIG. 3 is a perspective view showing the tape feeder.
Figure 5:
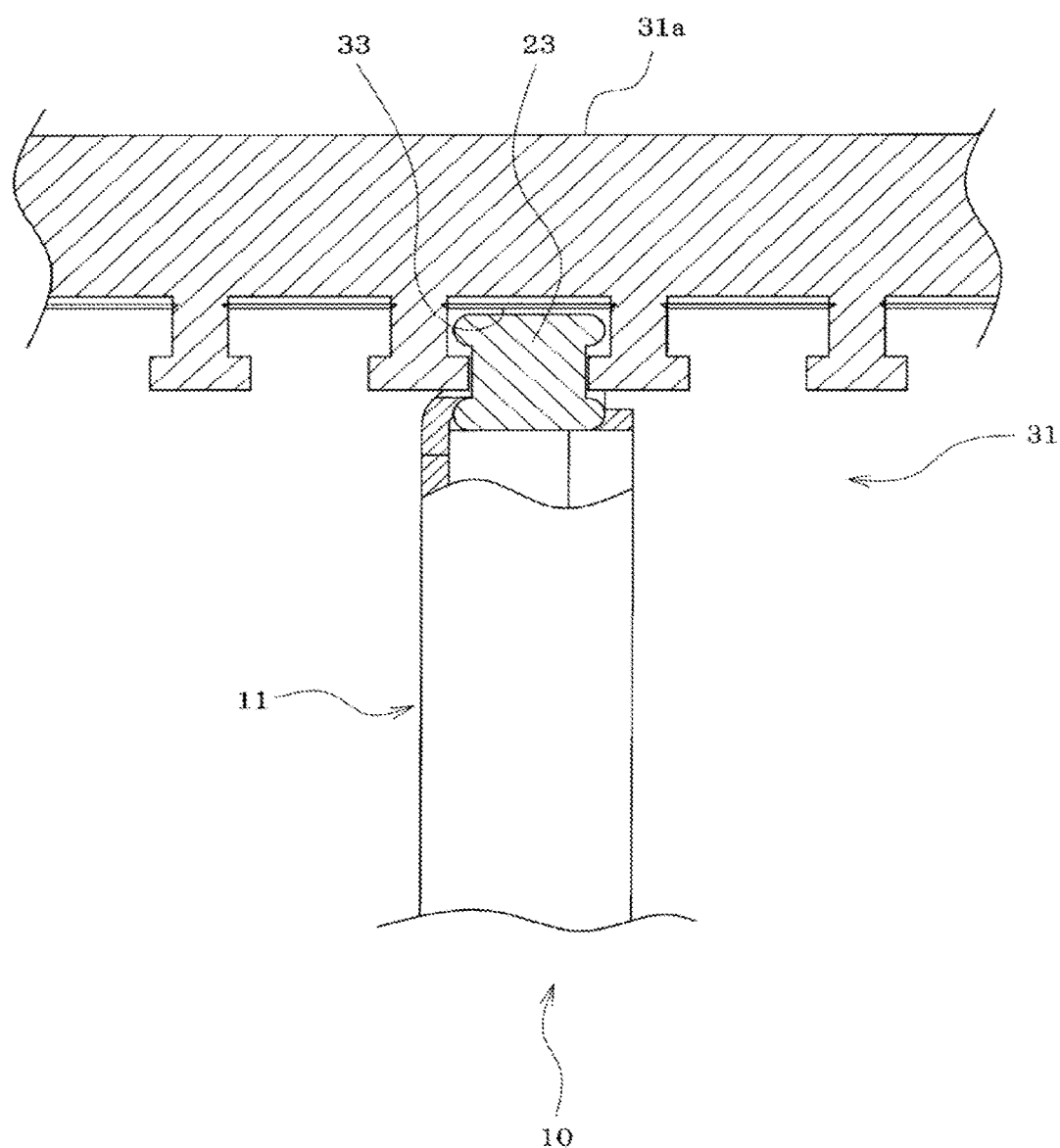
FIG. 5 is a longitudinal section front view showing an enlarged holding structure at an upper end face portion side of the tape feeder set in a feeder setting section of a component mounter.
Figure 6:
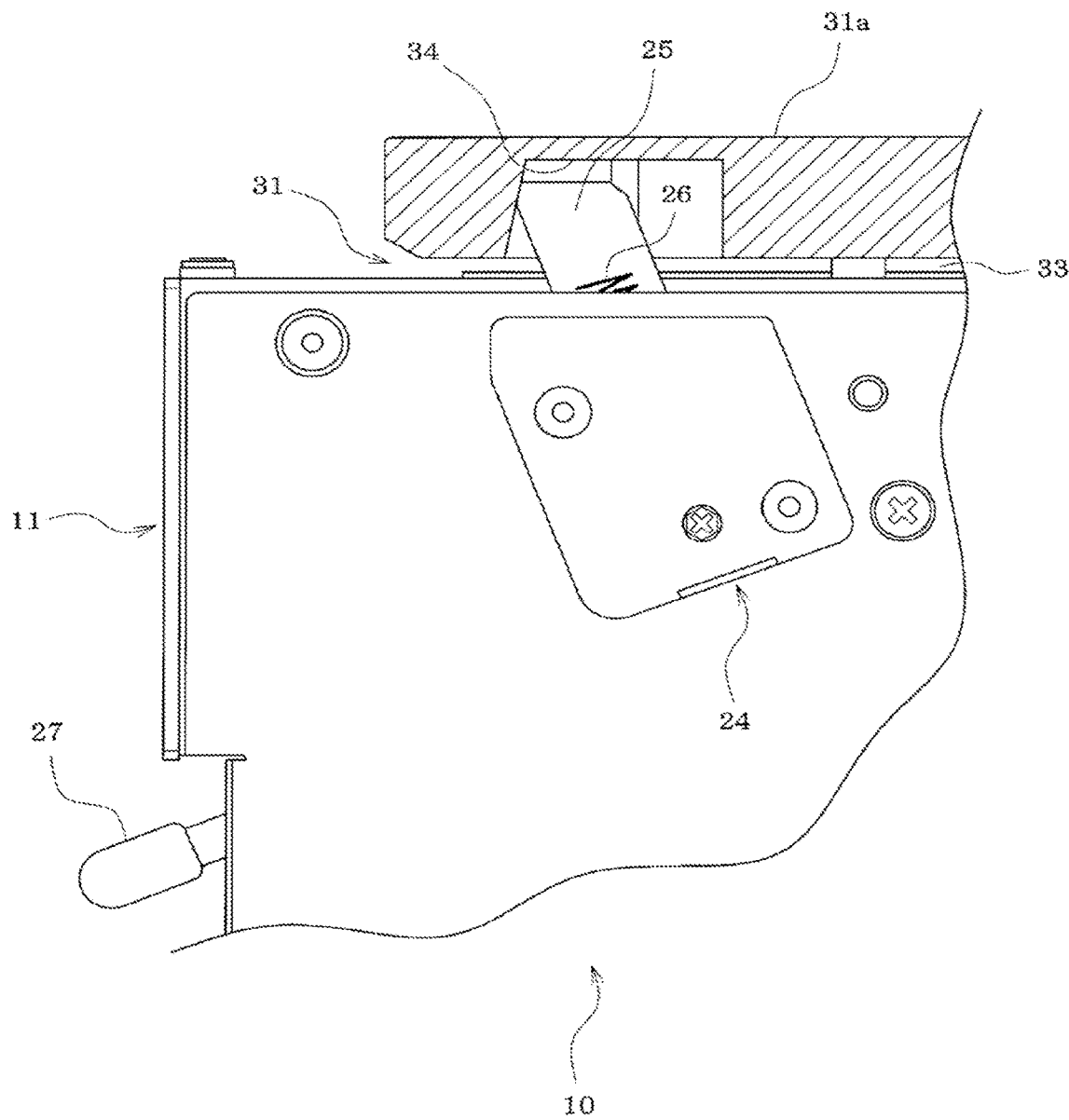
FIG. 6 is a partially cutaway side view showing an enlarged clamping structure at the upper end face portion side of the tape feeder set in the feeder setting section of the component mounter.

As shown in FIG. 3, on a portion above reel accommodation space 13, of the upper end face portion of feeder main body 11, guide rail 23 having a T-shaped cross section is provided as an upper holding member, so as to extend in an attachment and detachment direction of feeder main body 11 (front-rear direction). Correspondingly, as shown in FIGS. 5 and 6, in member 31a of an upper side of feeder setting section 31 of the component mounter, slot groove 33 having a T-shaped cross section into which guide rail 23 having a T-shaped cross section of feeder main body 11 is fitted in a slidably movable manner in the attachment and detachment direction of feeder main body 11 is provided so as to extend in the attachment and detachment direction of feeder main body 11. Guide rail 23 having a T-shaped cross section of feeder main body 11 is fitted into slot groove 33 having a T-shaped cross section of feeder setting section 31, so that slide movement of feeder main body 11 in the attachment and detachment direction is guided and feeder main body 11 is held in a state where being pulled out downward is prevented. As shown in FIG. 5, in member 31a of the upper side of feeder setting section 31 of the component mounter, multiple slot grooves 33 are provided at predetermined intervals such that multiple tape feeders 10 can be set in feeder setting section 31 side by side in a lateral direction.

In addition, clamping device 24 (see FIG. 6) that clamps feeder main body 11 in the attached state with respect to feeder setting section 31 of the component mounter is provided at a position near an end face portion of the upper end face portion of feeder main body 11 on feeder main body 11 detachment direction side (rear side). Clamping device 24 includes clamping member 25 that protrudes obliquely upward from the upper end face portion of feeder main body 11 during a clamp operation, spring 26 that biases clamping member 25 obliquely upward, which is a clamp direction, and operation lever 27 that operates a clamp release operation to retract clamping member 25 obliquely downward, which is a clamp release direction. Operation lever 27 is disposed so as to protrude from an end face portion on feeder main body 11 detachment direction side (rear side), and the operator can release the clamp by operating operation lever 27 of tape feeder 10 that is attached to feeder setting section 31.

Meanwhile, as shown in FIG. 6, clamp hole 34 is provided at a position corresponding to clamping member 25, of the upper side of feeder setting section 31 of the component mounter such that, by fitting clamping member 25 into clamp hole 34, feeder main body 11 is clamped in the attached state. In this case, by pushing clamping member 25 obliquely upward on feeder main body 11 detachment direction side (rear side) with spring 26, an upper end portion of clamping member 25 is pressed against a side face of clamp hole 34 on feeder main body 11 detachment direction side (rear side), and due to the reaction, feeder main body 11 is pressed toward the attachment direction side (front side), so that feeder main body 11 is positioned with high accuracy, and the connected state of connector 22 is held.

As shown in FIG. 3, in a lower end face portion of feeder main body 11, guide rail 28 having an I-shaped cross section is provided as a lower holding member, so as to extend in the attachment and detachment direction of feeder main body 11. Correspondingly, in a member (not shown) of a lower side of feeder setting section 31 of the component mounter, a rail groove (not shown) having an I-shaped cross section into which guide rail 28 having an I-shaped cross section of feeder main body 11 is fitted in a slidably movable manner in the attachment and detachment direction of feeder main body 11 is provided, and, by fitting guide rail 28 having an I-shaped cross section of feeder main body 11 into the rail groove having an I-shaped cross section of the lower side of feeder setting section 31, slide movement of feeder main body 11 in the attachment and detachment direction is guided and feeder main body 11 is held in a state where pulling out upward is not prevented. In this manner, even when manufacturing variation in height dimension of feeder setting section 31 of the component mounter or manufacturing variation in height dimension of feeder main body 11 is increased to some extent, the friction resistance can be prevented from increasing during the slide movement of feeder main body 11 in the attachment and detachment direction, and feeder main body 11 can be smoothly attached and detached.

Figure 2:
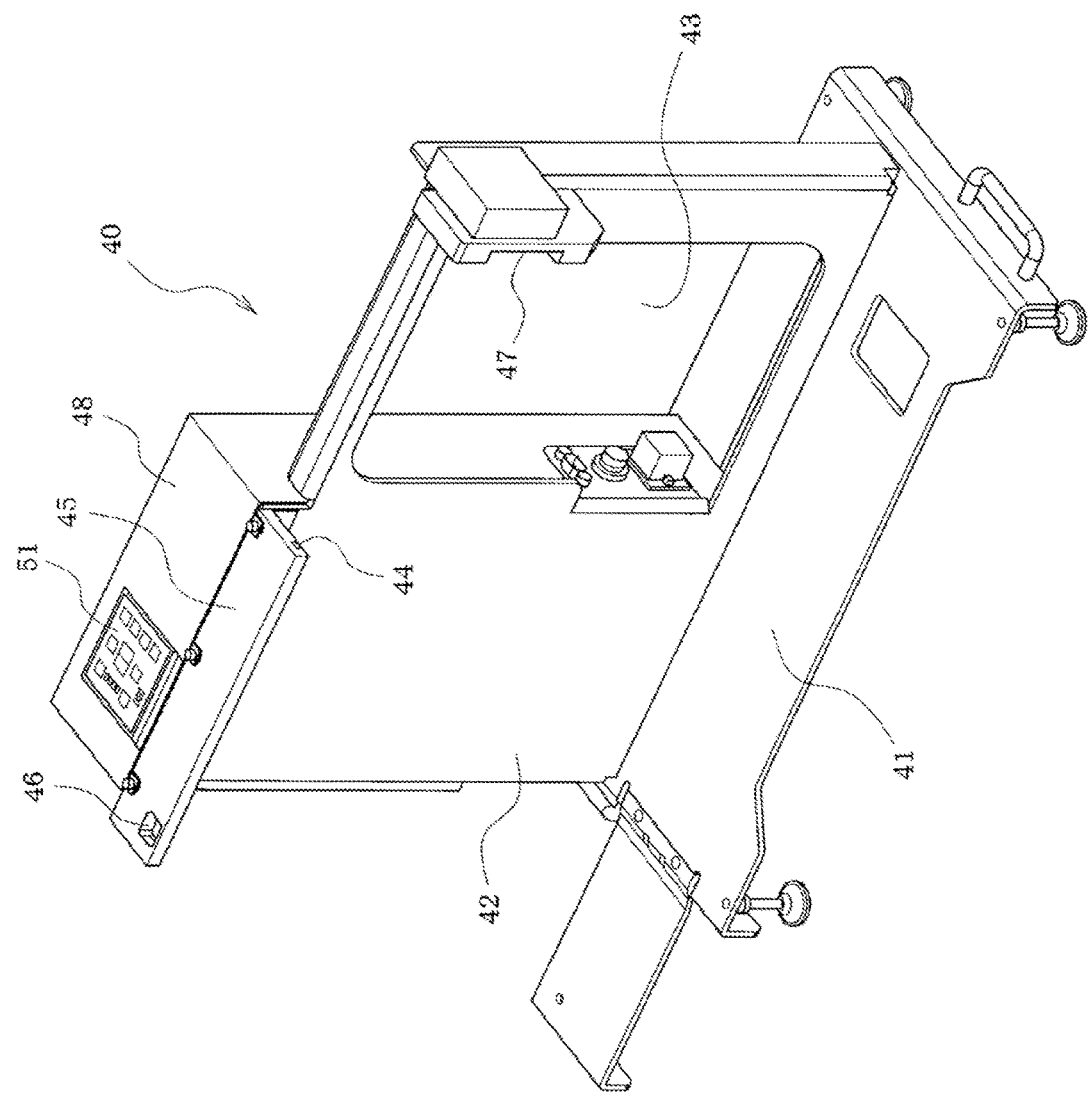
FIG. 2 is a perspective view showing the tape-feeder setting work apparatus in a state where the tape feeder is not set.

Next, a configuration of tape-feeder setting work apparatus 40 will be described with reference to FIGS. 1 and 2.

Tape-feeder setting work apparatus 40 has a structure for setting tape feeder 10 that is shared with feeder setting section 31 of the component mounter. Specifically, feeder support frame 42 is vertically fixed on feeder set base 41 positioned at a lower part of tape-feeder setting work apparatus 40. Feeder support frame 42 is formed in a slightly larger size than tape feeder 10, and opening portion 43 is formed at a portion of feeder support frame 42 that corresponds to electrical equipment accommodation space 20 of tape feeder 10. At an upper end portion of feeder support frame 42, upper end holding plate 45 (upper end holding member) that holds guide rail 23 having a T-shaped cross section of the upper end of tape feeder 10 is fixed horizontally, and at an under face of upper end holding plate 45, slot groove 44 having a T-shaped cross section into which guide rail 23 having a T-shaped cross section of the upper end of tape feeder 10 is inserted is formed. At a position of upper end holding plate 45 that corresponds to clamping member 25 of tape feeder 10, clamp hole 46 is provided, and by fitting clamping member 25 into clamp hole 46, tape feeder 10 is clamped in an attached state.

Meanwhile, connector 47 to which connector 22 of tape feeder 10 is inserted and connected is provided at a position of feeder support frame 42 that corresponds to connector 22 of tape feeder 10, and at both upper and lower sides of connector 47, positioning holes (not shown) into which two positioning pins 21, 21 of tape feeder 10 are inserted are provided. Connector 47 is a connector for both power supply and communication, and serves as a power supply section that supplies power from tape-feeder setting work apparatus 40 to tape feeder 10.

Figure 7:
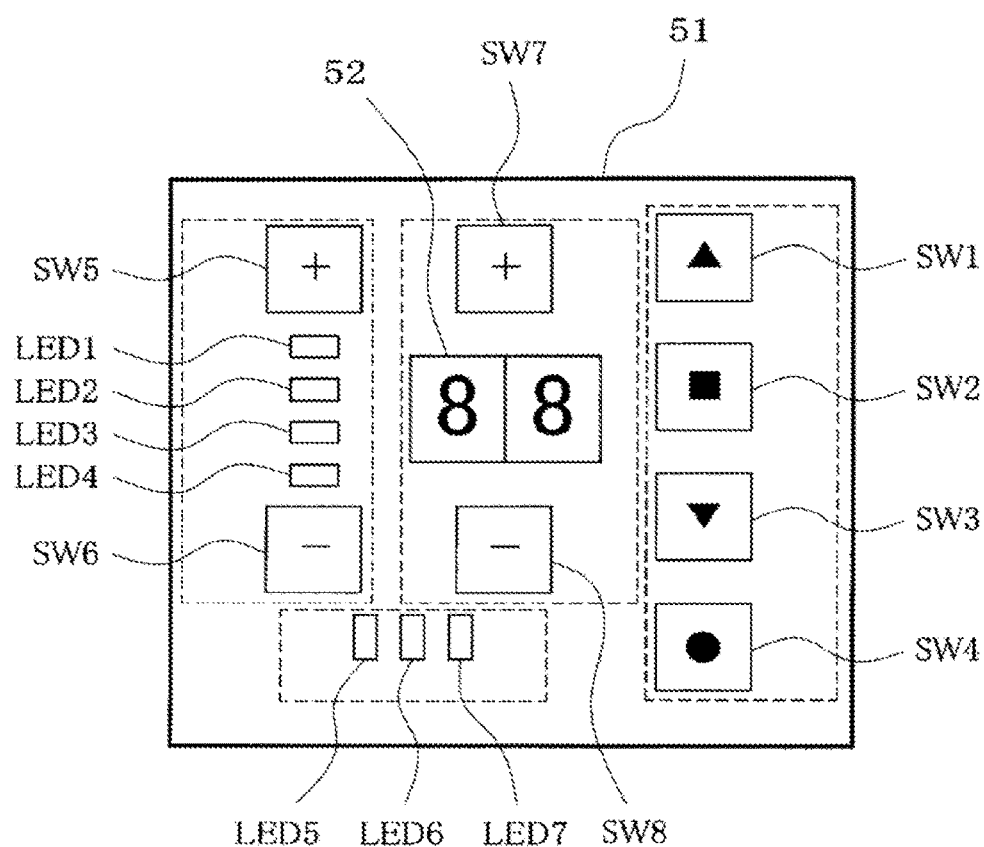
FIG. 7 is a plan view showing an operation panel.

On a back side of feeder support frame 42, control board storage box 48 is provided, and in control board storage box 48, a control board (not shown) constituting control section 49 (see FIG. 4) of tape-feeder setting work apparatus 40, a power supply board (not shown), and the like are provided. On an upper face of control board storage box 48, operation panel 51 (operation section) for the operator to operate tape feeding device 29 inside tape feeder 10 is provided. Hereinafter, a configuration of operation panel 51 will be described with reference to FIG. 7.

Operation panel 51 of the present embodiment includes multiple (for example, eight) operation switches SW1 to SW8 for controlling an operation of tape feeder 10, multiple (for example, seven) light emitting elements LED1 to LED7 that function as state display sections that display a state of tape feeder 10, and digital display 52.

Here, operation switch SW1 is an operation switch for performing a forward tape feeding operation of tape feeding device 29 (pitch-feeding operation). Operation switch SW2 is an operation switch for performing an origin setting operation of tape feeding device 29. Operation switch SW3 is an operation switch for performing a rewinding operation of tape feeding device 29 (reverse tape feeding operation). Operation switch SW4 is a spare operation switch that can be set optionally.

Operation switches SW5 and SW6 are operation switches for changing a tape feeding speed of tape feeding device 29 to, for example, five steps of ultra-high speed, high speed, medium speed, low speed, and ultra-low speed, the tape feeding speed is changed to a speed one step faster each time upper side operation switch SW5 is operated, and the tape feeding speed is changed to a speed one step slower each time lower side operation switch SW6 is operated. Each time the tape feeding speed is changed by the operation of two operation switches SW5 and SW6, the changed tape feeding speed is displayed by switching the light emitting elements that light up, among four light emitting elements LED1 to LED4 positioned between two operation switches SW5 and SW6. When the tape feeding speed is changed to ultra-low speed, all four light emitting elements LED1 to LED4 are turned off to display that the tape feeding speed is changed to ultra-low speed.

Operation switches SW7 and SW8 are operation switches for changing a tape feeding pitch of tape feeding device 29 to multiple steps within a range that can be changed, the tape feeding pitch is changed to a pitch one step longer each time upper side operation switch SW7 is operated, and the tape feeding pitch is changed to a pitch one step shorter each time lower side operation switch SW8 is operated. Each time the tape feeding pitch is changed by the operation of two operation switches SW7 and SW8, digital display 52 positioned between two operation switches SW7 and SW8 digitally displays the changed tape feeding pitch.

Multiple (for example, three) light emitting elements LED5 to LED7 positioned in a lower part of operation panel 51 are light emitting elements for displaying the state of tape feeder 10, and the light emitting element LED5 lights up when the power is supplied to tape feeder 10. Light emitting element LED6 is a spare light emitting element that can be set optionally, and light emitting element LED7 lights up when a communication error occurs with tape feeder 10.

A power switch may be provided on operation panel 51, but the power switch may be provided at a different position from operation panel 51, of tape-feeder setting work apparatus 40.

Each of operation switches SW1 to SW8 of operation panel 51 may be a mechanical switch such as a push-operated push button switch, or operation panel 51 may be made of a touch panel, and icons of each of operation switches SW1 to SW8 may be displayed on the touch panel such that the icons of each of operation switches SW1 to SW8 are touch-operated. Further, the function as the state display section that displays the state of tape feeder 10 may be displayed on a display device such as a liquid crystal panel.

Next, a work procedure for setting the component supply tape wound on tape reel 12 in tape feeder 10 by using tape-feeder setting work apparatus 40 having the above configuration will be described.

First, the operator performs the work of setting tape feeder 10 to tape-feeder setting work apparatus 40. At this time, connector 22 of tape feeder 10 is inserted and connected to connector 47 of tape-feeder setting work apparatus 40 by inserting guide rail 23 of the upper end of tape feeder 10 into slot groove 44 of upper end holding plate 45. Therefore, the power is supplied to tape feeder 10 from tape-feeder setting work apparatus 40 and control section 49 of tape-feeder setting work apparatus 40 and control section 30 of tape feeder 10 can communicate with each other. The set state of tape feeder 10 is held by fitting clamping member 25 of tape feeder 10 into clamp hole 46 of upper end holding plate 45.

Thereafter, the operator performs the work of setting tape reel 12 in reel accommodation space 13 of tape feeder 10. At this time, the upper side of reel accommodation space 13 is opened by opening reel holding plate 15 of tape feeder 10, the lower side of tape reel 12 is inserted into the inside of reel cover 14 from obliquely above, tape reel 12 is set in reel accommodation space 13, and reel holding plate 15 is closed. Thus, reel holding plate 15 covers the upper portion of tape reel 12 set in reel accommodation space 13 to hold tape reel 12 in the set state. Thereafter, the operator pulls out the tip portion of the component supply tape from tape reel 12, and sets feeding holes of the tip portion of the component supply tape in a state of meshing with teeth of a sprocket (not shown) of tape feeding device 29.

Before tape feeder 10 is set in tape-feeder setting work apparatus 40, tape reel 12 may be set in tape feeder 10, and then, tape feeder 10 may be set in tape-feeder setting work apparatus 40.

As described above, after the setting of tape feeder 10 in tape-feeder setting work apparatus 40 and the setting of tape reel 12 in tape feeder 10 are performed, the operator operates operation switch SW1 of operation panel 51 of tape-feeder setting work apparatus 40 to operate the tape feeding operation of tape feeding device 29 inside tape feeder 10 such that the tip portion of the component supply tape pulled out from tape reel 12 is fed to the component pickup position of tape feeder 10. At this time, as necessary, the operator may operate other operation switches SW2 to SW8 to perform the origin setting operation or rewinding operation of tape feeding device 29, or to change the tape feeding speed or tape feeding pitch.

When the tip portion of the component supply tape pulled out from tape reel 12 has been fed to the component pickup position of tape feeder 10 by operating operation switch SW1 of operation panel 51, the setting work of the component supply tape is completed. Thereafter, when the operator releases the clamp by operating operation lever 27 of clamping device 24 of tape feeder 10, tape feeder 10 is in a state of being detachable from tape-feeder setting work apparatus 40.

According to the present embodiment described above, since operation panel 51 for operating tape feeding device 29 inside tape feeder 10 is provided in tape-feeder setting work apparatus 40, the size and position of operation panel 51 can be provided at a size and position that are easy for the operator to operate, compared with a case where the operation section is provided in the tape feeder. Therefore, even when the size or position of the operation section of the tape feeder is difficult to operate, or even in a tape feeder without the operation section, the operator operates operation panel 51 of tape-feeder setting work apparatus 40, so that the setting work of the component supply tape can be performed efficiently.

Tape feeder 10 of the present embodiment has a configuration of a reel accommodation type for accommodating tape reel 12 therein, but may be has a configuration in which a reel holder is provided outside the tape feeder and the tape reel is held by the reel holder. In such a configuration, since a guide rail having a T-shaped cross section is provided at a lower end portion of the tape feeder, a slot groove having a T-shaped cross section into which the guide rail of the lower end portion of the tape feeder is fitted in a slidably movable manner may be provided on a feeder set base.

In addition, it is needless to say that the present disclosure is not limited to the above-described embodiment, and can be implemented with various changes within the scope not deviating from the gist, such as changing a configuration or position of operation panel 51, or providing an operation section corresponding to operation panel 51 on the lower part of tape-feeder setting work apparatus 40 such that the operator may operate the operation section with his/her foot.

REFERENCE SIGNS LIST

10 . . . Tape feeder, 11 . . . feeder main body, 12 . . . tape reel, 13 . . . reel accommodation space, 15 . . . reel holding plate, 22 . . . connector, 24 . . . clamping device, 25 . . . clamping member, 29 . . . tape feeding device, 30 . . . control section of tape feeder, 31 . . . feeder setting section of component mounter, 40 . . . tape-feeder setting work apparatus, 41 . . . feeder set base, 45 . . . upper end holding plate (upper end holding member), 46 . . . clamp hole, 47 . . . connector (power supply section), 49 . . . control section of tape-feeder setting work apparatus, 51 . . . operation panel (operation section), 52 . . . digital display (state display section), SW1 to SW8 . . . operation switch, LED1 to LED7 . . . light emitting element (state display section)

The invention claimed is:

1. A tape-feeder setting work apparatus used when an operator performs a work of setting a component supply tape wound on a tape reel, in a tape feeder, the tape-feeder setting work apparatus comprising:
    a feeder set base configured to hold the tape feeder in the setting work of the component supply tape;
    a feeder support frame vertically fixed on the feeder set base;
    an upper end holding plate configured to hold an upper end of the tape feeder, the upper end holding plate being disposed at an upper end portion of the feeder support frame;

a power supply section configured to supply a power to a tape feeding device inside the tape feeder;

a control board storage box configured to hold a control board of the tape-feeder setting work apparatus; and an operation panel configured to allow the operator to operate the tape feeding device inside the tape feeder, wherein when a work of setting a tip portion of the component supply tape by pulling out the tip portion from the tape reel set in the tape feeder held by the feeder set base is performed, the operator operates the operation panel to operate a tape feeding operation of the tape feeding device inside the tape feeder, and feeds the tip portion of the component supply tape pulled out from the tape reel to a component pickup position of the tape feeder.

2. The tape-feeder setting work apparatus according to claim 1,
wherein the tape feeder does not include the operation panel that operates the tape feeding device.

3. The tape-feeder setting work apparatus according to claim 1,
wherein the operation panel is provided with a state display section that displays a state of the tape feeder.

4. The tape-feeder setting work apparatus according to claim 1,
wherein the tape feeder is formed in a thin case shape and configured to accommodate the tape reel inside the tape feeder.

5. The tape-feeder setting work apparatus according to claim 4,
wherein the tape feeder is configured such that the tape reel is attached and detached through an opening portion provided on a side face of the feeder support frame,
a reel holding plate that holds the tape reel set inside the tape feeder in a set state is provided in the tape feeder to be opened and closed, and
the operator opens the reel holding plate in a case of an attaching or detaching work of the tape reel, so that the tape reel is in a state capable of being attached and detached.

6. The tape-feeder setting work apparatus according to claim 4,
wherein on an upper end face portion of the tape feeder, a guide rail having a T-shaped cross section that guides a movement of the tape feeder in an attachment and detachment direction with respect to an upper side of a feeder accommodation space of a component mounter and prevents the tape feeder from being pulled out downward is provided,
the upper end holding plate including a slot groove having a T-shaped cross section into which the guide rail having a T-shaped cross section of the tape feeder is inserted, the upper end holding plate extending in an attachment and detachment direction of the tape feeder, and
when the tape feeder is held by the feeder set base, the tape feeder is held in a state of being suspended from the slot groove having a T-shaped cross section by inserting the guide rail having a T-shaped cross section of the tape feeder into the slot groove having a T-shaped cross section.

7. The tape-feeder setting work apparatus according to claim 6,
wherein on the upper end face portion of the tape feeder, a clamping member that clamps the tape feeder in a set state with respect to the upper side of the feeder accommodation space of the component mounter is provided, and
the upper end holding plate is provided with a clamp hole into which the clamping member is fitted to clamp the tape feeder in the set state.

8. The tape-feeder setting work apparatus according to claim 1,
wherein the operation panel includes a switch for changing a tape feeding speed of the tape feeding device.

9. The tape-feeder setting work apparatus according to claim 1,
wherein the operation panel includes a switch for performing a rewinding operation of the tape feeding device.

10. The tape-feeder setting work apparatus according to claim 1,
wherein the operation panel includes a switch for changing a tape feeding pitch of the tape feeding device.

11. The tape-feeder setting work apparatus according to claim 1,
wherein the control board storage box is provided on a back side of the feeder support frame.

12. The tape-feeder setting work apparatus according to claim 1,
wherein the operation panel is disposed on an upper face of the control board storage box.

* * * * *